(12) United States Patent
Jung (10) Patent No.: US 11,287,147 B2
(45) Date of Patent: Mar. 29, 2022

(54) AIR HANDLING SYSTEM AND METHOD

(71) Applicant: NHN Corporation, Gyeonggi-do (KR)

(72) Inventor: Duk Kyo Jung, Gyeonggi-do (KR)

(73) Assignee: NHN CORPORATION, Gyeonggi-Do (KR)

( * ) Notice: Subject to any disclaimer, the term of this patent is extended or adjusted under 35 U.S.C. 154(b) by 190 days.

(21) Appl. No.: 16/445,172

(22) Filed: Jun. 18, 2019

(65) Prior Publication Data

US 2019/0383500 A1     Dec. 19, 2019

(30) Foreign Application Priority Data

Jun. 19, 2018 (KR) .......................... 10-2018-0069949

(51) Int. Cl.
*H05K 7/20* (2006.01)
*F24F 3/044* (2006.01)
(Continued)

(52) U.S. Cl.
CPC ............ *F24F 3/044* (2013.01); *F24F 1/0029* (2013.01); *F24F 1/0059* (2013.01);
(Continued)

(58) Field of Classification Search
CPC ...... F24F 1/0035; F24F 1/0029; F24F 1/0059; F24F 1/0038; H05K 7/20745; H05K 7/20754; H05K 7/20718
See application file for complete search history.

(56) References Cited

U.S. PATENT DOCUMENTS

| 9,763,363 B2 * | 9/2017 | Mornan ............ H05K 7/20745 |
| 2007/0169920 A1 * | 7/2007 | Yang .................... F28D 15/0275 |
| | | 165/104.34 |

(Continued)

FOREIGN PATENT DOCUMENTS

| FR | 2738777 A1 * | 3/1997 | ........... B60H 1/3207 |
| JP | 61099045 A * | 5/1986 | ............ F24F 1/0038 |

(Continued)

OTHER PUBLICATIONS

Office Action dated Sep. 25, 2019 for Korean Application No. 10-2018-0069949 and its English machine translation by Google Translate.

*Primary Examiner* — Devon Russell
(74) *Attorney, Agent, or Firm* — Ladas & Parry, LLP (57) ABSTRACT

An air handling system includes an indirect heat exchange apparatus performing heat exchange between external and internal air heat exchange passages; an external air circulation facility connected to the external air heat exchange passage and circulating an external air in an external space other than a target space through the external air heat exchange passage; an internal air circulation facility connected between the target space and the internal air heat exchange passage; the internal air circulation facility circulating an internal air in the target space through the internal air heat exchange passage; external and internal air temperature sensors disposed in the external and internal air circulation facilities to measure temperatures of the external and internal air; and a control apparatus controlling circulation of the external air within the external air circulation facility based on the temperatures of the external and internal air.

18 Claims, 4 Drawing Sheets

(51) Int. Cl.
   *F24F 1/0059*   (2019.01)
   *F24F 1/0029*   (2019.01)
   *F24F 110/10*   (2018.01)

(52) U.S. Cl.
   CPC ..... H05K 7/20745 (2013.01); H05K 7/20836 (2013.01); *F24F 2110/10* (2018.01)

(56) References Cited

U.S. PATENT DOCUMENTS

| | | | | |
|---|---|---|---|---|
| 2008/0003940 | A1* | 1/2008 | Haglid | F24F 12/006 |
| | | | | 454/228 |
| 2011/0036541 | A1* | 2/2011 | Takada | F24F 13/30 |
| | | | | 165/59 |
| 2012/0087086 | A1* | 4/2012 | Kok | H05K 7/20754 |
| | | | | 361/679.47 |
| 2012/0171943 | A1* | 7/2012 | Dunnavant | F28D 15/02 |
| | | | | 454/184 |
| 2013/0017774 | A1* | 1/2013 | Zorzit | F24F 1/0035 |
| | | | | 454/239 |
| 2013/0176675 | A1* | 7/2013 | Hundertmark | H05K 7/20745 |
| | | | | 361/679.31 |
| 2014/0349563 | A1* | 11/2014 | Honda | H05K 7/20709 |
| | | | | 454/184 |
| 2014/0355203 | A1* | 12/2014 | Kondo | H05K 7/20836 |
| | | | | 361/679.51 |
| 2015/0147951 | A1* | 5/2015 | Funada | H05K 7/20136 |
| | | | | 454/184 |
| 2017/0325354 | A1* | 11/2017 | Lee | H05K 5/0213 |

FOREIGN PATENT DOCUMENTS

| | | |
|---|---|---|
| JP | 2017-138673 | 8/2017 |
| KR | 10-2016-0092567 | 8/2016 |

* cited by examiner

AIR HANDLING SYSTEM AND METHOD

CROSS REFERENCE TO RELATED APPLICATION

This application claims priority to Korean Patent Application No. 10-2018-0069949, filed on Jun. 19, 2018, which is hereby incorporated by reference for all purposes as if fully set forth herein.

BACKGROUND

Technical Field

Exemplary embodiments relate to an air handling system and air handling method using the air handling system. More particularly, exemplary embodiments relate to an air handling system capable of controlling environmental parameters (e.g., air temperature and humidity) within a closed space.

Discussion of the Background

Controlling the environment of indoor spaces may be important to maintain equipment or products that are sensitive to temperature and humidity changes. Such equipment or products may include climate sensitive products, computers, servers, or other factory equipment. However, controlling the environment of the indoor space can be energy intensive, especially during extremely hot or humid seasons (e.g., summer). The intense energy required for air handling systems designed to control climates or environments have may cause high strains on operating budgets as well as cause additional damage to the environment from carbon emissions if hydrocarbons (e.g., oil, gas, or coal) are a source fuel for the energy consumption.

The above information disclosed in this Background section is only for enhancement of understanding of the background of the inventive concept, and, therefore, it may contain information that does not form the prior art that is already known in this country to a person of ordinary skill in the art.

SUMMARY

Some exemplary embodiments may provide an air handling system configured to perform an air handling process in a target space using minimal energy consumption. Certain exemplary embodiments may also provide an air handling method for the air handling system that may use a minimal amount of energy.

Additional aspects will be set forth in the detailed description which follows, and, in part, will be apparent from the disclosure, or may be learned by practice of the inventive concept.

Various exemplary embodiments may provide an air handling system including an indirect heat exchange apparatus where heat exchange between an external air heat exchange passage and an internal air heat exchange passage is performed, an external air circulation facility connected to the external air heat exchange passage, the external air circulation facility configured to circulate an external air in an external space other than the target space through the external air heat exchange passage, an internal air circulation facility connected between the target space and the internal air heat exchange passage, the internal air circulation facility is configured to circulate an internal air in the target space through the internal air heat exchange passage, an external air temperature sensor disposed in the external air circulation facility to measure a temperature of the external air, an internal air temperature sensor disposed in the internal air circulation facility to measure a temperature of the internal air, and a control apparatus controlling circulation amount of the external air within the external air circulation facility based on the temperature of the external air and the temperature of the internal air.

The control apparatus may control rotation speed of the external air circulation so fan proportionally to a difference between the external air temperature and the internal air temperature.

The control apparatus may control rotation speed of the external air circulation fan proportionally to a difference between the external air temperature and the internal air temperature.

The external air circulation facility may further comprise an external air inlet passage connected to an entrance or inlet of the external air heat exchange passage to deliver the external air from the external space to the external air heat exchange passage, and an external air outlet passage connected to an exit or outlet of the external air heat exchange passage to deliver the external air discharged from the external air heat exchange passage to the external space.

The external air circulation fan may be disposed in at least one of the external air inlet passage and external air outlet passage.

The external air temperature sensor may be disposed in the external space and adjacent to the external air inlet passage.

The target space may comprise a server region where a server system comprising one or more servers is disposed, an inlet region receiving air to be introduced into the server region, and an outlet region receiving air expelled from the server region.

The internal air circulation facility may comprise an internal air circulation fan controlled by the control apparatus to adjust the circulation of the internal air within the internal air heat exchange passage.

The air handling system may further comprise one or more pressure sensors or a pressure difference sensor disposed in the target space to measure a pressures difference between the inlet region and the outlet region and to transmit the measured pressure difference to the control apparatus.

The control apparatus may control the internal air circulation fan, based on the pressure difference measured by one or more pressure sensors or the pressure difference sensor, to adjust amount of circulation of the internal air.

The control apparatus may control rotation speed of the internal air circulation fan proportionally to the pressure difference.

The internal air circulation facility may further comprise an internal air inlet passage connected to an entrance or inlet of the internal air heat exchange passage to deliver the internal air from the outlet region of the target space to the internal air heat exchange passage, and an internal air outlet passage connected to an exit or outlet of the internal air heat exchange passage to deliver the external air discharged from the internal air heat exchange passage to the inlet region of the target space.

The internal air inlet passage may comprise an inlet space connected to the entrance of the internal air heat exchange passage, and an inlet connection connected between the inlet space and outlet region of the target space. The internal air inlet passage may comprise an outlet space connected to the exit or outlet of the internal air heat exchange passage, and an outlet connection connected between the outlet space and the inlet region.

The internal air temperature sensor may be disposed in the outlet space.

The internal air circulation fan may be disposed in the inlet connection.

The internal air circulation facility may comprise an internal air damper is disposed in the internal air inlet passage. The internal air damper may be controlled by the control apparatus to block or allow circulation of the internal air in the internal air heat exchange passage.

The internal air damper may be disposed in the outlet space and adjacent to the exit or outlet of the internal air heat exchange passage.

The air handling system may further comprise a direct adjusting apparatus or direct air control device disposed in the outlet space and adjacent to the internal air damper controlled by the control apparatus to reduce the temperature of the internal air that has passed through the internal air damper.

The control apparatus operates the internal air damper in an open mode for a predetermined time when the direct air control device is turned off.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and apparatus are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element or layer, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, and/or sections, these elements, components, regions, and/or sections should not be limited by these terms. These terms are used to distinguish one element, component, region, and/or section from another element, component, region, and/or section. Thus, a first element, component, region, and/or section discussed below could be termed a second element, component, region, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

"Air handling" may mean, for example, but not limited to, controlling or processing temperature, humidity, cleanness, and/or flow distribution of air to satisfy the environmental parameter requirements of an enclosed space. An air handling system may control or process such air handling or conditioning. For instance, in factories, warehouses, laboratories, server rooms (i.e., rooms where large-scale servers are situated), or other places housing sensitive products or equipment, the installation and operation of the air handling system may be needed in order to maintain the adequate function of the equipment or prevent the degradation of sensitive products.

The air handling system may include, for instance, but not limited to, a heat source equipment, an air conditioning equipment, a heat transfer equipment, an automatic control equipment, a refrigerating machine, a boiler, a coolant pump, a water supply equipment, and piping. The heat source equipment may control or process the heat load of the entire air handling system. The air conditioning equipment may cool, heat, or remove particles of air that enters into the target space. The air conditioning equipment may also remove moisture (i.e., reducing humidity) or add moisture (i.e., increasing humidity) to air that enters into the target space. Thus, the air conditioning equipment may include an air cooler, a dehumidifier, a heater, an air filter, a humidifier, and a blower. The heat transfer equipment may transfer and circulate air between the heat source equipment and the air conditioning equipment, circulate air between the air conditioning equipment and the target space, and regulate the intake of outdoor air into the target space. The automatic control equipment may control the heat source equipment, the air conditioning equipment, and the heat transfer equipment such that the required air handling condition can be satisfied within a certain space.

However, the air handling system may require large amounts of energy to control or process air for the target space in order to satisfy the required or optimum climate conditions for equipment (e.g., servers) located in the target space. Energy consumption may be high during extremely hot and humid days when the equipment in the target space requires energy intensive cooling and/or dehumidifying processes by the air handling system. Accordingly, some exemplary embodiments of devices and methods that may require minimal energy consumption for maintaining equipment or products at required climate conditions are described below.

Figure 1:
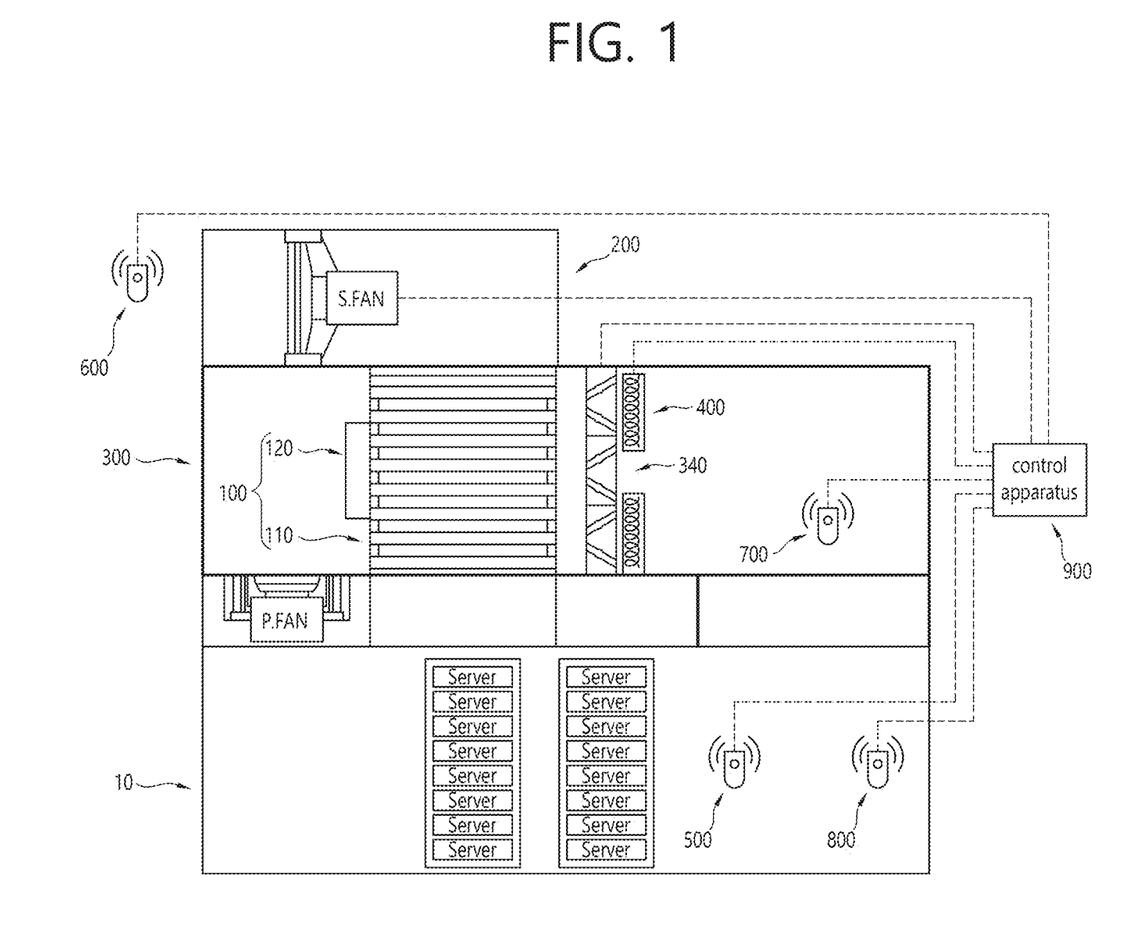
FIG. 1 is a conceptual diagram illustrating an air handling system according to an embodiment of the present disclosure.
Figure 2:
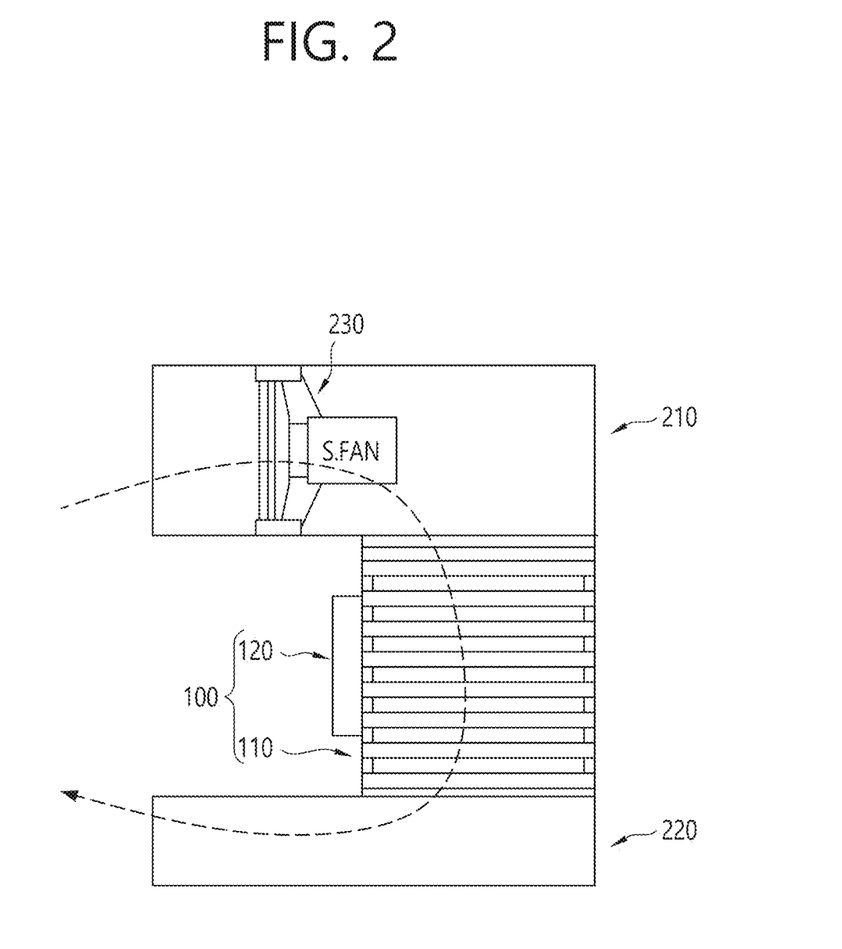
FIG. 2 is a conceptual diagram illustrating an external air circulation facility and an indirect heat exchange apparatus according to an embodiment of the present disclosure.
Figure 3:
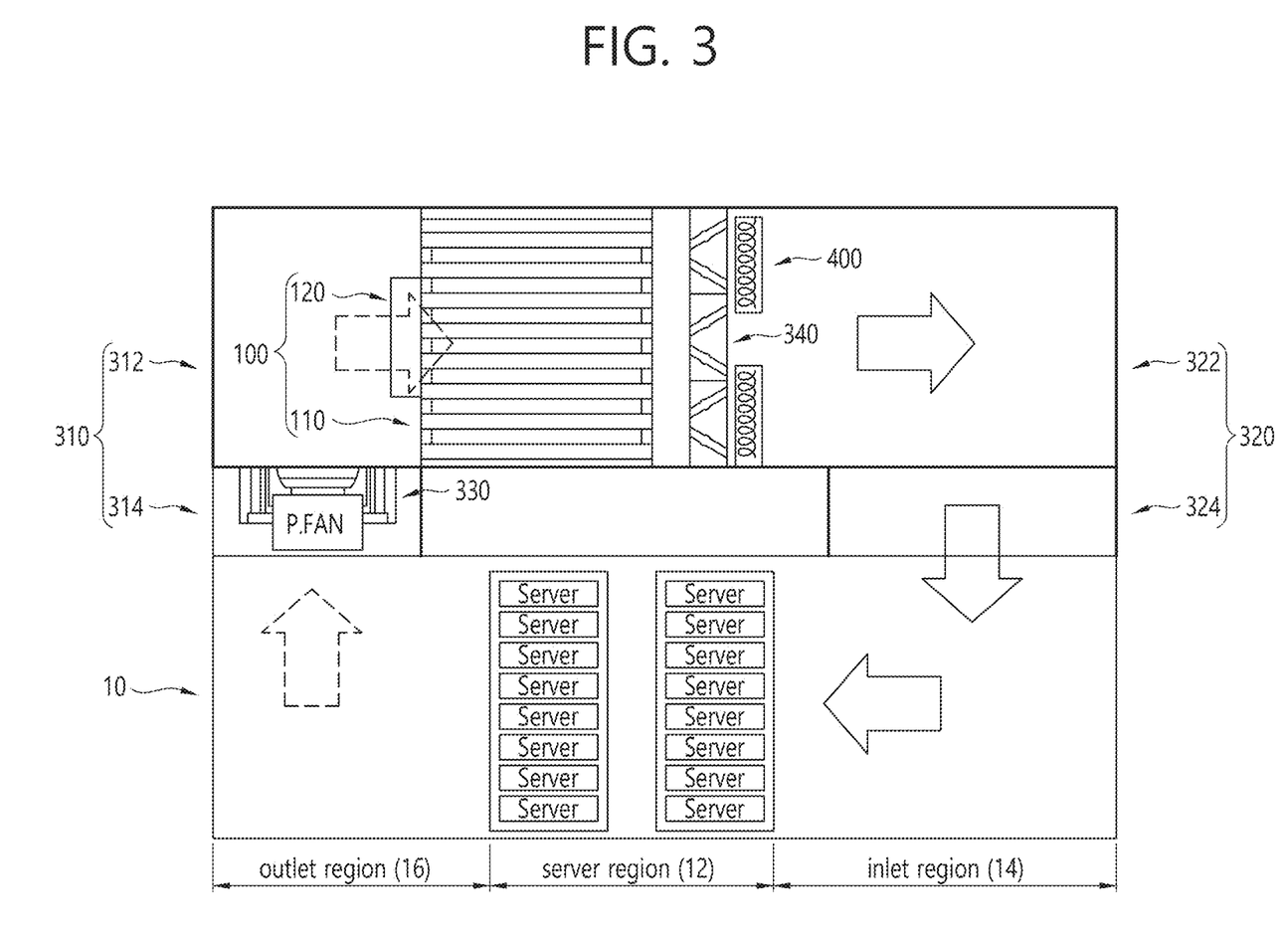
FIG. 3 is a conceptual diagram illustrating a target space and an internal air circulation facility according to an embodiment of the present disclosure.
Figure 4:
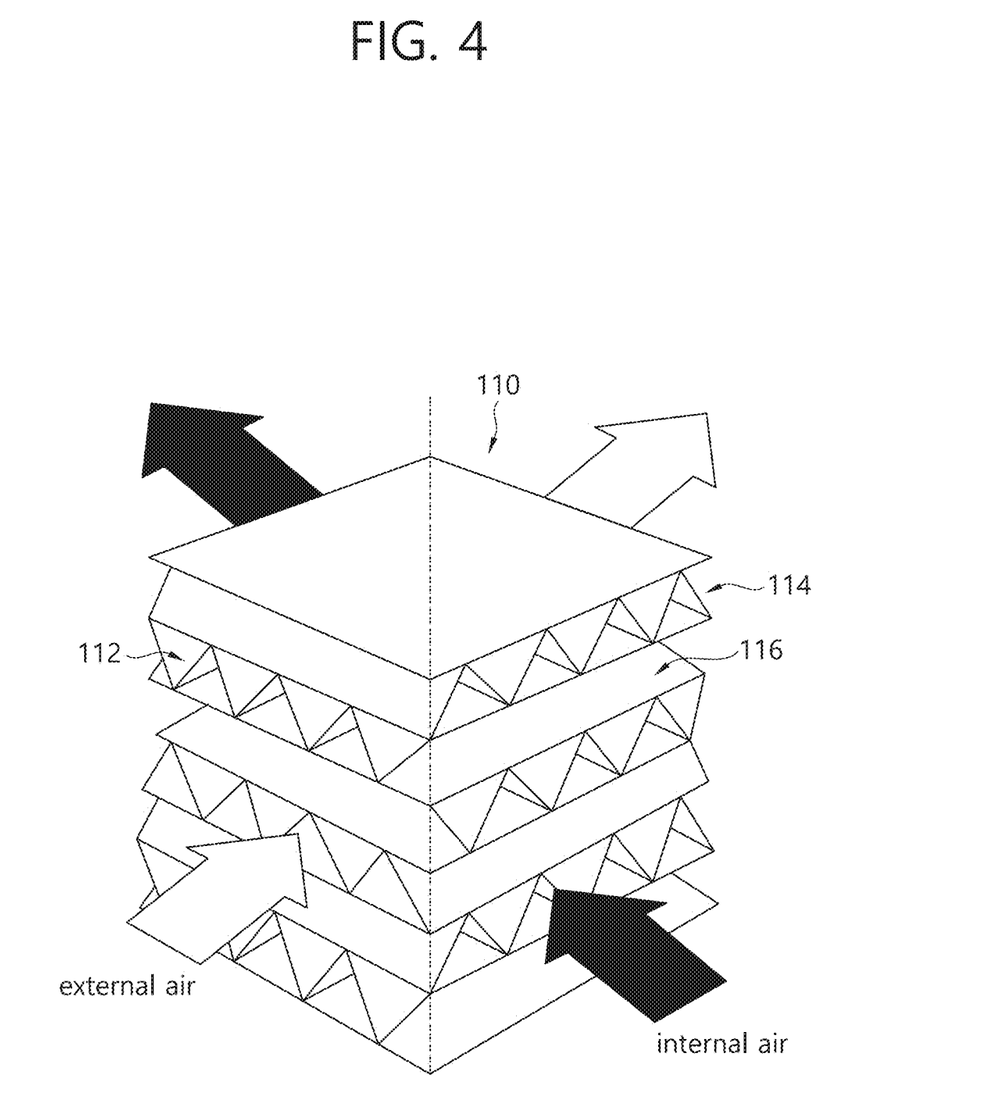
FIG. 4 is a perspective view illustrating an example of a heat exchanger of an indirect heat exchange apparatus according to an embodiment of the present disclosure.

FIG. 1 is a conceptual diagram illustrating an air handling system according to an embodiment of the present disclosure. FIG. 2 is a conceptual diagram illustrating an external air circulation facility and an indirect heat exchange apparatus in the air handling system of FIG. 1. FIG. 3 is a conceptual diagram illustrating a target space and an internal air circulation facility in the air handling system of FIG. 1. FIG. 4 is a perspective view illustrating an example of a heat exchanger of the indirect heat exchange apparatus of FIG. 2.

Referring to FIG. 1 to 4, the air handling system for air conditioning of a target space 10 according to the present embodiment includes an indirect heat exchange apparatus 100, an external air circulation facility 200, an internal air circulation facility 300, a direct control device 400, a pressure sensor or differential pressure sensor 500, an external air temperature sensor 600, an internal air temperature sensor 700, a target space temperature sensor 800, and a control apparatus or controller 900. The target space 10 may be a closed space in a building, for example, a server room which may accommodate a large-scale server system. More specifically, the target space 10 includes a server region 12 in which one or more servers are disposed, an inlet region 14 that receives air to be introduced into the server region 12, and an outlet region 16 that receives air expelled from the server region 12.

The indirect heat exchange apparatus 100 may be configured to exchange heat between external air in an external space other than the target space 10 and internal air in the target space 10. For example, the external space may be a space outside the air handling system. The indirect heat exchange apparatus 100 includes a heat exchanging unit or heat exchanger 110 and an evaporating unit 120. Here, the external air may be, for example, outdoor air existing in the outdoor space.

The heat exchanging unit or heat exchanger 110 may include an external air heat exchange passage 112 through which the external air passes, and internal air heat exchange passage 114 through which the internal air passes. The external air heat exchange passage 112 and the internal air heat exchange passage 114 are disposed adjacent to each other to facilitate heat exchange with each other. For example, as shown in FIG. 4, a plurality of external air heat exchanging passages 112 and a plurality of internal air heat exchanging passages 114 may be stacked alternately and/or cross each other perpendicularly.

The heat exchanging unit 110 may further include a heat transfer medium 116 disposed between the external air heat exchange passage 112 and the internal air heat exchange passage 114 to transfer heat. The heat transfer medium 116 may be made of a material that can perform heat exchange between the airs, for example, stainless steel.

The evaporating unit 120 may be controlled by the control apparatus 900 and may inject liquid to the heat exchanging unit 110 so that vaporization can be performed in the heat exchanging unit 110. For example, the evaporating unit 120 may inject liquid onto the surface of the heat transfer medium 116 facing the external air heat exchange passage 112. In this way, when the vaporization portion injects the liquid onto the surface of the heat transfer medium 116 and vaporizes it, the heat transfer medium 116 is deprived of heat for vaporization and the temperature can be reduced. In addition, the evaporating unit 120 may control the temperature drop of the heat transfer medium 116 by adjusting the amount of liquid sprayed onto the surface of the heat transfer medium 116.

The external air circulation facility 200 may be connected to the external air heat exchange passage 112 of the indirect heat exchange apparatus 100 such that the external air can circulate through the external air heat exchange passage 112. For example, the external air circulation facility 200 may include an external air inlet passage 210, an external air outlet passage 220, and an external air circulation fan 230.

The external air inlet passage 210 may be connected to an inlet or entrance of the external air heat exchange passage 112 such that the external air can flow into the external air heat exchange passage 112.

The external air outlet passage 220 may be connected to an outlet or exit of the external air heat exchange passage 112 of the indirect heat exchange apparatus 100 such that the external air can be discharged from the external air heat exchange passage 112.

The external air circulating fan 230 may be disposed in at least one of the external air inlet passage 210 and the external air outlet passage 220. The external air circulating fan 230 may be controlled by the control apparatus 900 and configured to adjust the circulation of the external air in the external air heat exchange passage 112. For example, as shown in FIG. 2, the external air circulating fan 230 may be disposed in the external air inlet passage 210 to control the circulation of the external air in the external air heat exchange passage 112. In the present embodiment, the external air circulation fan 230 can adjust the amount of circulation of the external air in the external air heat exchange passage 112 by controlling the rotating speed of the fan.

The internal air circulation facility 300 may connect between the target space 10 and the internal air heat exchange passage 114 of the indirect heat exchange apparatus 100 such that the internal air can circulate through the internal air heat exchange passage 114. The internal air circulation facility 300 may include an internal air inlet passage 310, an internal air outlet passage 320, an internal air circulating fan 330, and an internal air damper 340.

The internal air inlet passage 310 may connect between the outlet region 16 of the target area 10 and an inlet or entrance of the internal heat exchange passages 114 to allow the internal air in the target space 10 to flow into the internal air heat exchange passage 114. The internal air inlet passage 310 may include an inlet space 312 connected to an inlet or entrance of the internal air heat exchange passage 114, and an inlet connection 314 connecting between the inlet space 312 and outlet region 16 of the target space 10.

The internal air outlet passage 320 may connect between the inlet region 14 of the target space 10 and an outlet or exit of the internal air heat exchange passage 114 of the indirect heat exchange apparatus 100 so that the internal air discharged from the internal air heat exchange passage 114 can be re-provided for the target space 10. The internal air outlet passage 320 may include an outlet space 322 connected to the outlet or exit of the internal air heat exchange passage 114, and an outlet connection 324 connecting between the outlet space 322 and the inlet region 14.

The internal air circulation fan 330 may be disposed in at least one of the internal air inlet passage 310 and the internal air outlet passage 320. The internal air circulation fan 330 may be controlled by the control apparatus 900 and configured to adjust the circulation of the internal air in the internal air heat exchange passage 114 of the indirect heat exchange apparatus 100. For example, the internal air circulation fan 330 may be disposed in the inlet connection 314 of the internal air inlet passage 310 to control the circulation of the internal air in the internal air heat exchange passage 114. In the present embodiment, the internal air circulation fan 330 can adjust the amount of circulation of the internal air in the internal air heat exchange passage 114 by controlling the rotational speed of the fan.

The internal air damper 340 may be disposed in at least one of the internal air inlet passage 310 and the internal air outlet passage 320. The internal air damper 340 may be controlled by the control apparatus 900 and configured to block or allow circulation of the internal air in the internal air heat exchange passage 114 of the indirect heat exchange apparatus 100. More specifically, the control apparatus 900 controls the internal air damper 340 to open or close. The status where the internal air damper 340 is called 'open mode'. For example, the internal air damper 340 may be disposed adjacent to the outlet or exit of the internal air heat exchange passage 114 in the outlet space 322 of the internal air outlet passage 320 to adjust the amount, direction, or speed of the internal air circulated in the internal air heat exchange passage 114.

The direct air control device 400 may be placed in the target space 10 or in the internal air circulation facility 300. The direct air control device 400 may be controlled by the control apparatus 900 and configured to perform direct air control cooling the internal air. For example, the direct control device 400 may be disposed adjacent to the internal air damper 340 within the discharge space 322 of the internal air outlet passage 320, as shown in FIGS. 1 and 3. The direct air control device 400 may include an air conditioner that is controlled by the control apparatus 900 to cool the internal air.

One or more pressure sensors or differential pressure sensors 500 may be disposed in the target space 10. The pressure sensor(s) or differential pressure sensor(s) 500 may be configured to measure the pressure difference between the inlet region 14 and the outlet region 16 and to transmit the measured pressure difference by wired or wireless communication to the control apparatus 900. For example, the pressure sensor(s) or differential pressure sensor(s) 500 may be disposed in one or both of the inlet region 14 and the outlet region 16, or may be disposed across the inlet region 14 and the outlet region 16, to measure pressure difference between the inlet region 14 and the outlet region 16.

The external air temperature sensor 600 may be disposed in the external space where the external air exists, for example, in the outdoor space or outside of the air handling system. The external air temperature sensor 600 may be configured to measure the temperature of the external air, and transmit the measured external air temperature to the control apparatus 900 by wire or wireless communication. For example, the external air temperature sensor 600 may be disposed adjacent to the inlet or entrance of the external air inlet passage 210 in order to more accurately measure the temperature of the external air supplied to the external air inlet passage 210.

The internal air temperature sensor 700 may be disposed in the internal air circulation facility 300. The internal air temperature sensor 700 may be configured to measure the temperature of the internal air and transmit the measured temperature of the internal air to the control apparatus 900 by wire or wireless communication. For example, the internal air temperature sensor 700 is disposed in the discharge space portion 322 of the internal air outlet passage portion 320 and measures the temperature of the internal air discharged from the internal air heat exchange passage 114 of the indirect heat exchange apparatus 100.

The target space temperature sensor 800 may be disposed within the target space 10. The target space temperature sensor 800 may be configured to measure the temperature of the internal air in the target space 10 and transmit the measured temperature of the internal air to the control apparatus 900 by wire or wireless communication. For example, the target space temperature sensor 800 may be disposed within the inlet region 14 of the target space 10 to measure the temperature of the internal air in the inlet region 14.

The control apparatus 900 may be configured to receive the pressure difference between the inlet region 14 and the discharge region 16 from the differential pressure sensor 500 in real time or at predetermined interval. Alternatively, the control apparatus 900 may be configured to receive the pressures of the inlet region 14 and the discharge region 16 from one or more pressure sensors 500 and calculate the pressure difference between the inltest region 14 and the discharge region 16. The control apparatus 900 may be configured to receive the temperature of the external air flowing into the external air inlet passage portion 210 from the external air temperature sensor 800 in real time or at predetermined interval. The control apparatus 900 may be configured to receive the temperature of the internal air in the internal air outlet passage portion 320 from the internal air temperature sensor 700 in real time or at a predetermined interval. The control apparatus 900 may be configured to receive the temperature of the internal air in the inlet region 14 of the target space 10 from the target space air temperature sensor 800 in real time or at predetermined interval.

The control apparatus 900 may be configured to control at least one of the evaporating unit, the external air circulating fan 230, the internal air circulation fan 330, the internal air damper 340 and the direct air control device 400 using at least one of the pressure difference measured by the differential pressure sensor 500, the pressures measured by the pressure sensors 500, the temperature of the external air measured by the external air temperature sensor 600, the temperature of the internal air measured by the internal air temperature sensor 700, and the temperature of the inlet region 14 measured by the target space temperature sensor 800.

The control apparatus 900 may be configured to control the operation of the external air circulating fan 230 based on the temperature of the external air measured by the external air temperature sensor 600 and/or the temperature of the internal air measured by the internal air temperature sensor 700. For example, the control apparatus 900 may control the number of rotations of the external air circulation fan 230 according to the difference between the temperature of the external air and the temperature of the internal air. That is, the control apparatus 900 controls to increase the number of rotations of the external air circulating fan 230 when the difference between the temperature of the external air and the temperature of the internal air becomes larger or over a predetermined value or threshold, and to decrease the number of rotations of the external air circulating fan 230 when the difference between the temperatures of the internal air becomes smaller or less than a predetermined value or threshold. As a result, the difference between the temperature of the external air and the temperature of the internal air can be reduced.

The control apparatus 900 may be configured to control the operation of the external air circulation fan 230 based on one or more of the temperature of the inlet region 14, the temperature of the external air measured by the external air temperature sensor 600 and the temperature of the internal air measured by the internal air temperature sensor 700. For example, when the temperature of the air in the inlet region 14 exceeds a reference temperature, the control apparatus 900 increases the number of rotations of the external air circulation fan 230 to reduce the air temperature of the inlet region 14. In addition, the control apparatus 900 may be configured to control or operate at least one of the evaporating unit 120 and the direct air control device 400 to reduce the temperature of the inlet region 13 when the temperature of the inlet region 14 does not decrease below the reference temperature in spite of increasing the number of revolutions of the external air circulation fan 230, or when the air temperature needs to be rapidly decreased. Meanwhile, the control apparatus 900 may monitor the temperature in the target space 10 using the air temperature of the inlet region 14, and display the monitored temperature through a display device 950.

The control apparatus 900 can be configured to control the operation of the internal air circulation fan 330 based on the pressure difference measured by the differential pressure sensor 500 of the pressures measured by the pressure sensor(s) 500. For example, when the control apparatus 900 determines that the pressure difference measured by the differential pressure sensor 500 exceeds a reference value, the control apparatus 900 rotates the internal air circulation fan 330 to reduce the pressure difference below the reference value. When the control apparatus 900 determines that the pressure difference measured by the differential pressure sensor 500 continues to increase beyond the reference value, the control apparatus 900 increases the number of rotations of the internal air circulation fan 330 to suppress increase of the pressure difference. Meanwhile, the control apparatus 900 may monitor the scale or the driving state of the server arranged in the server region 12 using the pressure difference measured by the differential pressure sensor 500, and may display the monitored state through the display device 950.

Meanwhile, the control apparatus 900 may turn on an air conditioner, such as the direct control device 400, to reduce the temperature of the internal air in the discharge space portion 322. Thereafter, when the control apparatus 900 turns off the direct control device 400, the control apparatus 900 may operate the internal air damper 340 in an open mode for a predetermined time, for example, for about 45 seconds to remove water droplets generated in the direct control device 400.

As described above, according to the present embodiment, the control apparatus 900 may reduce the difference temperatures of the external air and the internal air by controlling the external air circulation fan 230 based on at least one of the temperature of the external air measured by the external air temperature sensor 600 and the temperature of the internal air measured by the internal air temperature sensor 700. For example, when the temperature of the external air is lower than the temperature of the internal air, the control apparatus 900 may reduce the internal air in the target space 10 by indirect heat exchange between the external air and the internal air to reduce energy for decreasing the temperature of the internal air.

The control apparatus 900 may reduce the pressure difference measured by the pressure difference sensor 500 by controlling the operation of the internal air circulation fan 330 based on the pressure difference measured by the differential pressure sensor 500 or the pressures measured by the pressure sensor(s) 500.

The physical components used to implement the various logic or method steps described in this application may be implemented with the control apparatus 900, external air temperature sensor 600, internal air temperature sensor 700, target space temperature sensor 800, and/or one or more components thereof, may be implemented via one or more general purpose processor, digital signal processor (DSP), application specific integrated circuits (ASIC), a field programmable gate array (FPGA) or other programmable logic device, discrete circuits such a discrete grate or transistor logic, discrete hardware components or any combination thereof. A general purpose processor may be a multiprocessor or any conventional processor, controller, microcontroller, or state machine. A processor may also be implemented as any combination of computing apparatus such as a combination of DSP and a multiprocessor, a plurality of multiprocessors, one or more multiprocessors along with a DSP core. Alternatively, some methods or method steps may be implemented by specific circuitry.

In this manner, the features, functions, processes, etc., described herein may be implemented via software, hardware, firmware, or any combination thereof. If implemented in software, the functions may be stored as one or more instructions on a non-transitory computer readable medium or non-transitory processor-readable medium. The various steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include random access memory (RAM), read only memory (ROM), electrically erasable programmable read only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An air handling system for air-conditioning a target space, comprising:
    an indirect heat exchange apparatus comprising an external air heat exchange passage and an internal air heat exchange passage, the indirect heat exchange apparatus configured to exchange heat between the external air heat exchange passage and the internal air heat exchange passage;
    an external air circulation facility connected to the external air heat exchange passage, the external air circulation facility configured to circulate an external air in an external space other than the target space through the external air heat exchange passage;
    an internal air circulation facility connected between the target space and the internal air heat exchange passage, the internal air circulation facility configured to circulate an internal air in the target space through the internal air heat exchange passage;
    an external air temperature sensor disposed in the external air circulation facility and configured to measure a temperature of the external air;
    an internal air temperature sensor disposed in the internal air circulation facility and configured to measure a temperature of the internal air; and
    a control apparatus controlling circulation of the external air within the external air circulation facility based on the temperature of the external air and the temperature of the internal air,
    wherein the external air circulation facility comprises an external air circulation fan configured to adjust the circulation of the external air within the external air heat exchange passage, and
    wherein the control apparatus is configured to increase rotation speed of the external air circulation fan as a difference between the temperature of the external air and the temperature of the internal air is increased, and to decrease the rotation speed of the external air circulation fan as the difference between the temperature of the external air and the temperature of the internal air is decreased.

2. The system of claim 1, wherein the external air circulation facility further comprises:
    an external air inlet passage connected to an inlet of the external air heat exchange passage of the indirect heat exchange apparatus to deliver the external air from the external space to the external air heat exchange passage; and
    an external air outlet passage connected to an outlet of the external air heat exchange passage of the indirect heat exchange apparatus to deliver the external air discharged from the external air heat exchange passage to the external space.

3. The system of claim 2, wherein the external air circulation fan is disposed in the external air inlet passage of the external air circulation facility.

4. The system of claim 2, wherein the external air temperature sensor is disposed in the external space and adjacent to the external air inlet passage of the external air circulation facility.

5. The system of claim 1, wherein the target space comprises:
    a server region where one or more servers are disposed;
    an inlet region receiving air to introduce the air into the server region; and
    an outlet region receiving air expelled from the server region.

6. The system of claim 5, wherein the internal air circulation facility comprises an internal air circulation fan configured to adjust the circulation of the internal air within the internal air heat exchange passage of the indirect heat exchange apparatus.

7. The system of claim 6, further comprising one or more pressure sensors disposed in the target space to measure a pressure difference between the inlet region and the outlet region of the target space and to transmit the measured pressure difference to the control apparatus.

8. The system of claim 7, wherein the control apparatus is configured to control the internal air circulation fan, based on the pressure difference measured by the one or more pressure sensors, to adjust amount of circulation of the internal air.

9. The system of claim 8, wherein the control apparatus is configured to control rotation speed of the internal air circulation fan in proportion to the pressure difference.

10. The system of claim 6, wherein the internal air circulation facility further comprises:
    an internal air inlet passage connected to an inlet of the internal air heat exchange passage of the indirect heat exchange apparatus to deliver the internal air from the outlet region of the target space to the internal air heat exchange passage; and
    an internal air outlet passage connected to an outlet of the internal air heat exchange passage of the indirect heat exchange apparatus to deliver the external air discharged from the internal air heat exchange passage to the inlet region of the target space.

11. The system of claim 10, wherein:
    the internal air inlet passage of the internal air circulation facility comprises:
    an inlet space connected to the inlet of the internal air heat exchange passage of the indirect heat exchange apparatus; and
    an inlet connection connected between the inlet space and the outlet region of the target space, and
    the internal air output passage of the internal air circulation facility comprises:
    an outlet space connected to the outlet of the internal air heat exchange passage; and an outlet connection connected between the outlet space of the internal air inlet passage and the inlet region of the target space.

12. The system of claim 11, wherein the internal air temperature sensor is disposed in the outlet space of the internal air inlet passage of the internal air circulation facility.

13. The system of claim 11, wherein the internal air circulation fan is disposed in the inlet connection of the internal air inlet passage of the internal air circulation facility.

14. The system of claim 11, wherein the internal air circulation facility comprises an internal air damper disposed in the internal air inlet passage, wherein the internal air damper is configured to block or allow circulation of the internal air in the internal air heat exchange passage of the indirect heat exchange apparatus.

15. The system of claim 14, wherein the internal air damper is disposed in the outlet space of the internal air inlet passage and adjacent to the outlet of the internal air heat exchange passage of the indirect heat exchange apparatus.

16. The system of claim 15, further comprising a direct air control device disposed in the outlet space of the internal air inlet passage of the internal air circulation facility and adjacent to the internal air damper and controlled by the control apparatus to reduce the temperature of the internal air that has passed through the internal air damper.

17. The system of claim 16, wherein the control apparatus is configured to control the internal air damper to be open for a predetermined time period after the direct air control device is turned off.

18. The system of claim 1, wherein the external air heat exchanging passage and the internal air heat exchanging passage are implemented as a plurality of external air heat exchanging passages and a plurality of internal air heat exchanging passages, respectively, which are stacked alternately.

* * * * *